United States Patent
Takase et al.

(10) Patent No.: US 8,921,807 B2
(45) Date of Patent: Dec. 30, 2014

(54) IN SITU CLEANING DEVICE FOR LITHOGRAPHIC APPARATUS

(75) Inventors: Hiromitsu Takase, Utsunomiya (JP); Ichiro Tanaka, Utsunomiya (JP); Akira Miyake, Nasukarasuyama (JP)

(73) Assignee: Canon Kabushiki Kaisha (JP)

( * ) Notice: Subject to any disclaimer, the term of this patent is extended or adjusted under 35 U.S.C. 154(b) by 49 days.

(21) Appl. No.: 13/462,013

(22) Filed: May 2, 2012

(65) Prior Publication Data

US 2012/0288799 A1 Nov. 15, 2012

(30) Foreign Application Priority Data

May 9, 2011 (JP) .................. 2011-104739

(51) Int. Cl.
*H01J 37/30* (2006.01)
*B08B 5/00* (2006.01)
*H01J 37/317* (2006.01)

(52) U.S. Cl.
CPC .............. *H01J 37/3177* (2013.01); *B08B 5/00* (2013.01); *H01J 2237/022* (2013.01); *H01J 2237/03* (2013.01); *H01J 2237/0435* (2013.01); *H01J 2237/0453* (2013.01); *H01J 2237/1205* (2013.01)
USPC ...................... 250/453.11; 134/1.1

(58) Field of Classification Search
CPC ............... H01J 37/32862; H01J 2237/022; B08B 7/00; B08B 7/0035; B08B 9/00; B08B 13/00; B08B 9/34; B08B 9/023; H01L 21/02046; H01L 21/02049; G03F 7/70925; A61G 9/02; Y10S 438/905; C23C 16/4405
USPC ............ 250/453.11, 454.11, 455.11; 134/1.1, 134/1.2, 1.3, 22.11
See application file for complete search history.

(56) References Cited

U.S. PATENT DOCUMENTS

| | | | |
|---|---|---|---|
| 5,539,211 A | 7/1996 | Ohtoshi et al. | |
| 5,785,796 A * | 7/1998 | Lee | 156/345.24 |
| 6,051,286 A * | 4/2000 | Zhao et al. | 427/576 |
| 6,105,589 A * | 8/2000 | Vane | 134/1.1 |
| 6,394,109 B1 * | 5/2002 | Somekh | 134/39 |
| 7,147,722 B2 * | 12/2006 | Klebanoff et al. | 134/1 |
| 8,092,641 B1 * | 1/2012 | Xiao | 156/345.37 |
| 8,349,125 B2 * | 1/2013 | Vane et al. | 156/345.43 |
| 2002/0053353 A1 * | 5/2002 | Kawata et al. | 134/1.3 |
| 2007/0289710 A1 * | 12/2007 | Hudson et al. | 156/345.38 |
| 2010/0117001 A1 * | 5/2010 | Looije | 250/395 |
| 2011/0017247 A1 * | 1/2011 | Vane et al. | 134/198 |
| 2012/0178025 A1 * | 7/2012 | Tanaka et al. | 430/296 |

FOREIGN PATENT DOCUMENTS

| | | | |
|---|---|---|---|
| JP | 61020321 A | 1/1986 | |
| JP | 8139010 A | 5/1996 | |

* cited by examiner

*Primary Examiner* — Brooke Purinton
(74) *Attorney, Agent, or Firm* — Rossi, Kimms & McDowell LLP (57) ABSTRACT

A lithographic apparatus which performs drawing on a substrate with a charged-particle beam, includes an optical system having an aperture plate in which a first number of apertures are formed to pass a first number of charged-particle beams to perform the drawing, a substrate holder, a cleaning unit configured to clean the aperture plate, and a chamber containing the optical system and the substrate holder. The cleaning unit includes a case having an emitting hole plate in which a second number of emitting holes are formed, the second number being smaller than the first number, an active species source configured to generate active species in the case, and a driving mechanism configured to move the case.

6 Claims, 7 Drawing Sheets

IN SITU CLEANING DEVICE FOR LITHOGRAPHIC APPARATUS

BACKGROUND OF THE INVENTION

1. Field of the Invention

The present invention relates to a charged-particle beam lithographic apparatus and a method of manufacturing a device using the same.

2. Description of the Related Art

A charged-particle beam lithographic apparatus that draws a pattern on a substrate using a charged-particle beam such as an electron beam or an ion beam is known. Japanese Patent Laid-Open No. 61-020321 discloses an electron beam exposure apparatus, in which an electrode is inserted into a column and a radio frequency or high frequency voltage is applied across the electrode and the inner wall of the column to generate a plasma in the column, thereby removing any substances adhering on the inner wall surface of the column using the plasma. Japanese Patent Laid-Open No. 08-139010 discloses a charged beam apparatus, in which a plasma is generated by a plasma generating device arranged outside a barrel, and introduced into the barrel, thereby removing any contaminants.

In the charged-particle beam lithographic apparatus, when an aperture plate having apertures is present in the path through which an active species (radicals fall into the concept of the active species) flows, the conductance of the portion where the aperture plate is placed is low so the active species is inactivated, thus making it impossible to satisfactorily clean the interior of the apertures. When the amount of gas for generating an active species is increased so as to increase the amount of active species, the pressure in the chamber rises. Then, the time required to reduce the pressure in the chamber after the end of cleaning prolongs, so the downtime may prolong.

SUMMARY OF THE INVENTION

The present invention provides, for example, a technique advantageous in reduction of a rise in pressure in the chamber upon cleaning of apertures.

One of the aspects of the present invention provides a lithographic apparatus which performs drawing on a substrate with a charged-particle beam, the apparatus comprising: an optical system including an aperture plate in which a first number of apertures are formed, and configured to pass a first number of charged-particle beams to perform the drawing; a holder configured to hold the substrate; a cleaning unit configured to clean the aperture plate; and a chamber which contains the optical system and the holder, wherein the cleaning unit comprises a case including an emitting hole plate in which a second number of emitting holes are formed, the second number being smaller than the first number, an active species source configured to generate active species in the case, and a driving mechanism configured to move the case, the active species being emitted from the second number of emitting holes by a difference between pressures of an internal space and an external space of the case arranged in the chamber, wherein the driving mechanism is configured to move the case, with the emitting hole plate facing the optical system, so that a region of the aperture plate surrounding the first number of apertures are cleaned by the active species emitted from the second number of emitting holes.

Further features of the present invention will become apparent from the following description of exemplary embodiments with reference to the attached drawings.

DESCRIPTION OF THE EMBODIMENTS

Figure 1:
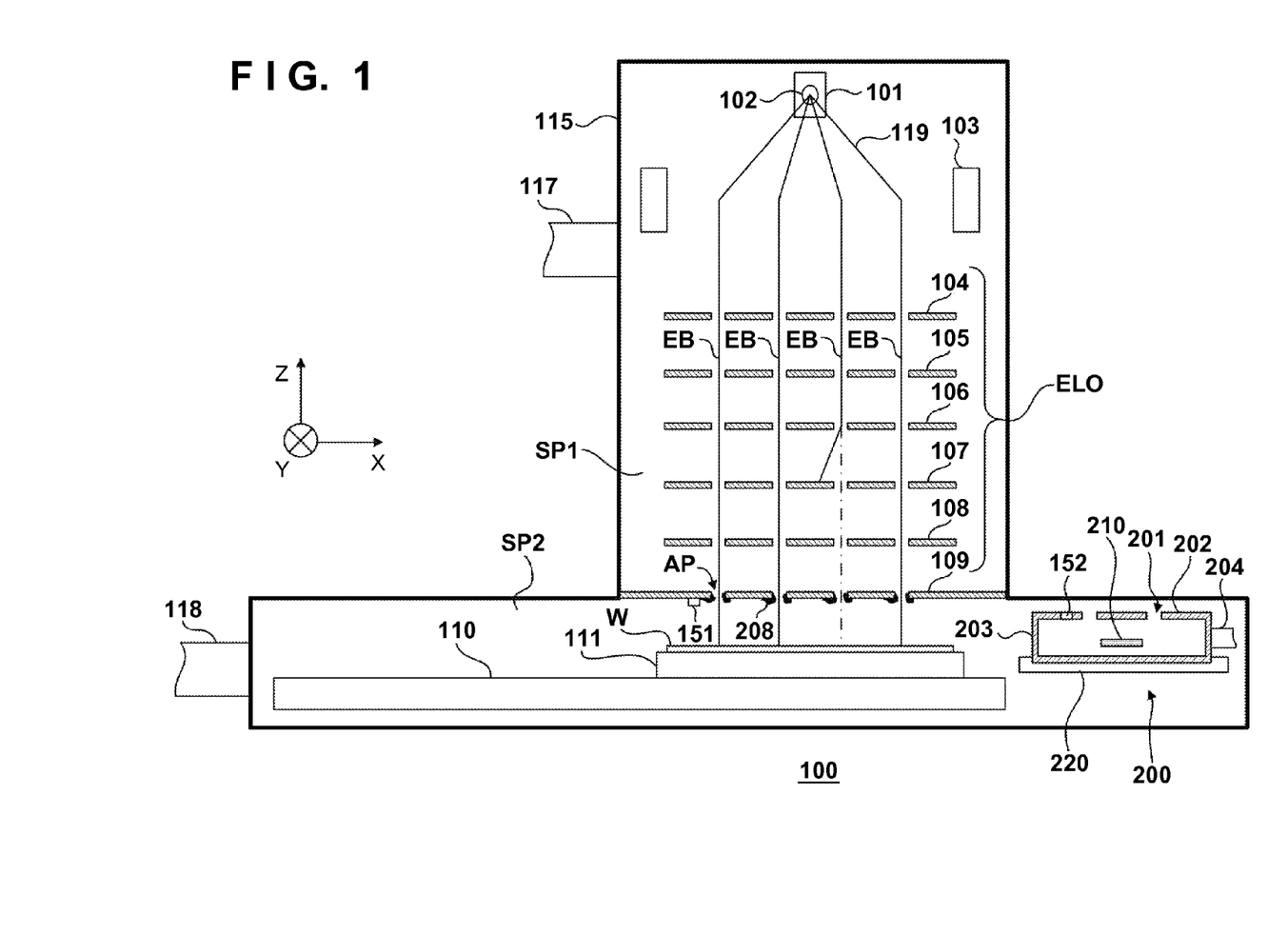
FIG. 1 is a view for explaining the configuration and drawing process of a charged-particle beam lithographic apparatus according to the first embodiment of the present invention.
Figure 2:
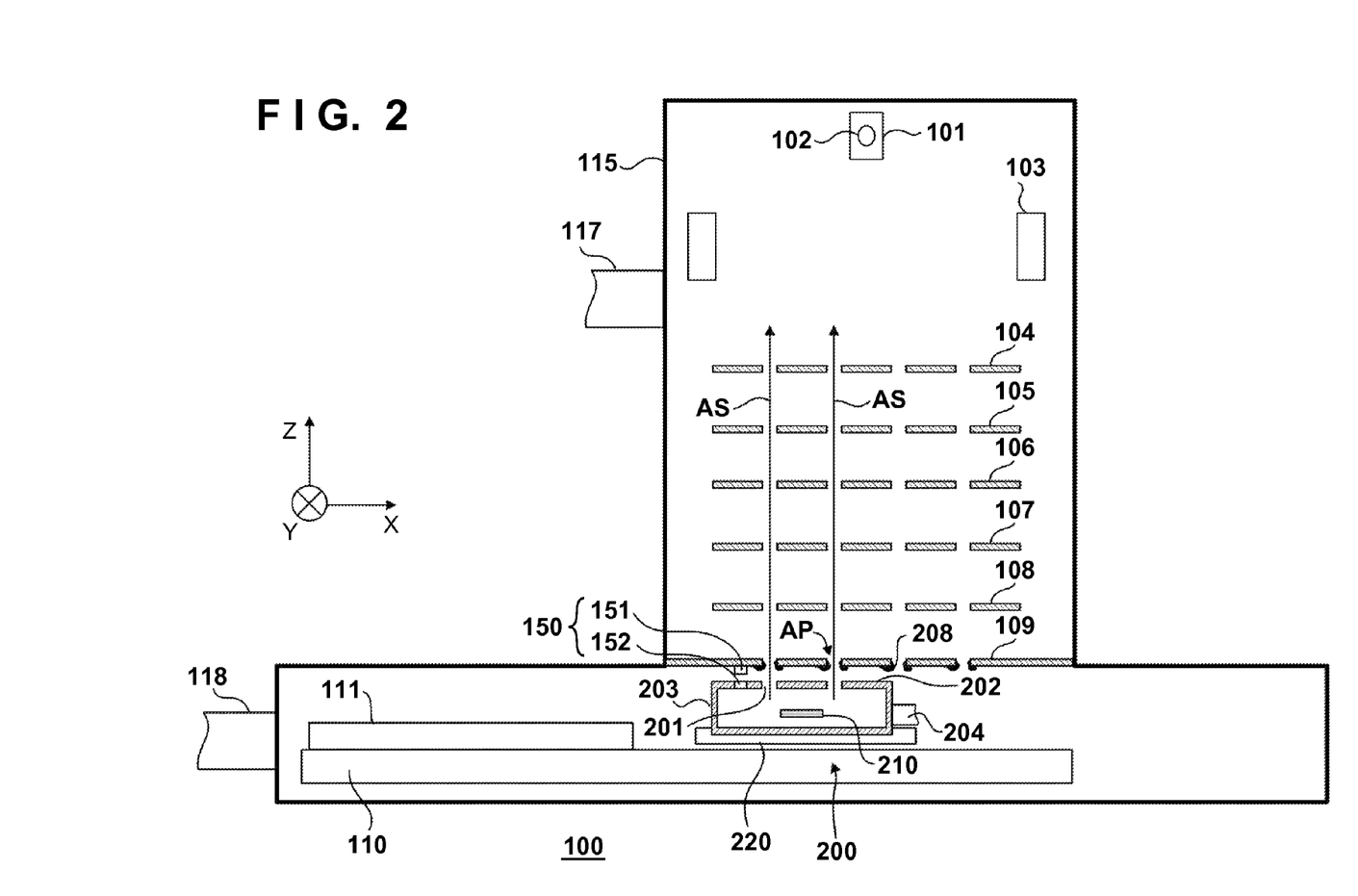
FIG. 2 is a view for explaining the configuration and cleaning process of the charged-particle beam lithographic apparatus according to the first embodiment of the present invention.
Figure 3:
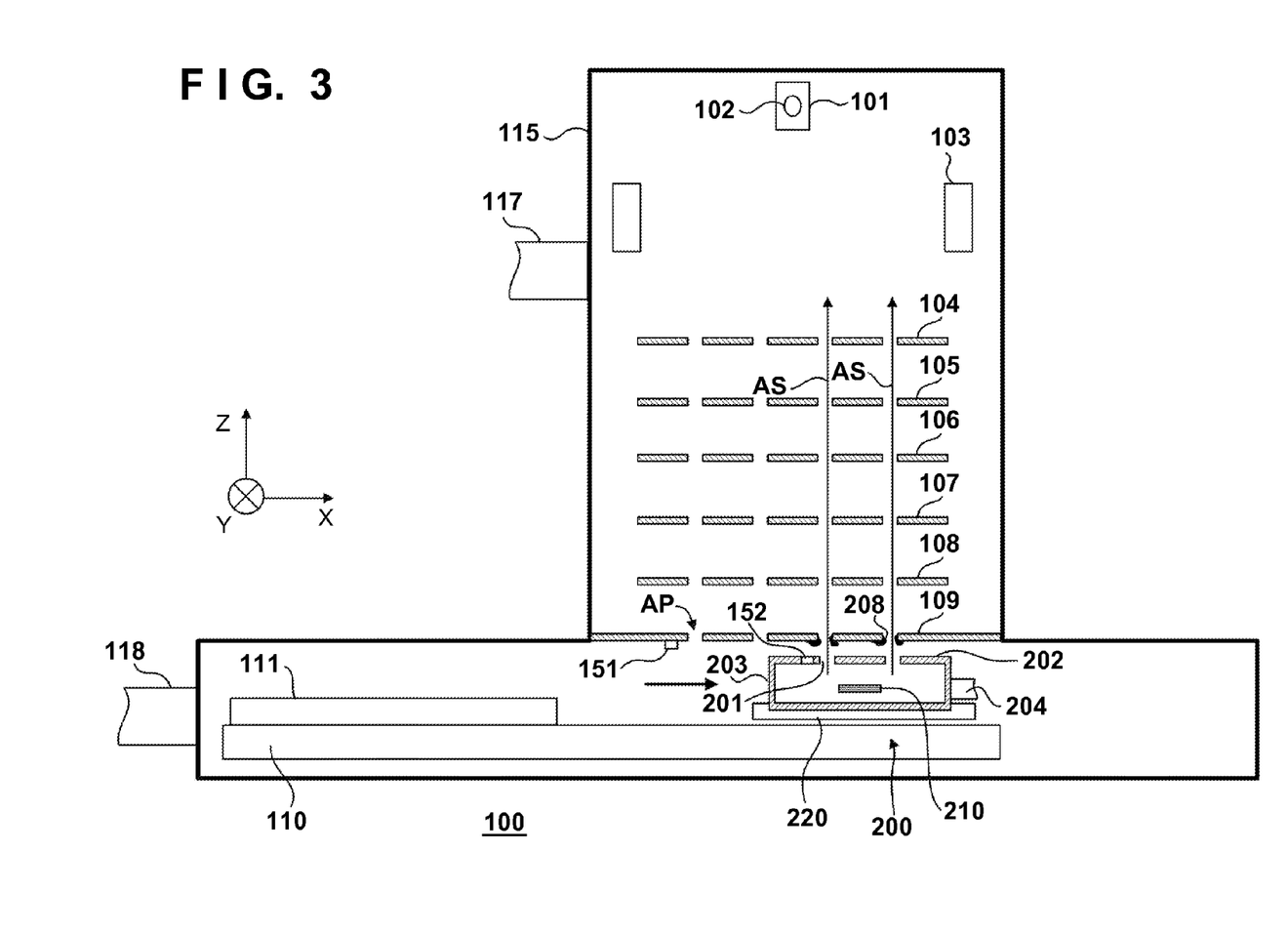
FIG. 3 is a view for explaining the configuration and cleaning process of the charged-particle beam lithographic apparatus according to the first embodiment of the present invention.

A charged-particle beam lithographic apparatus 100 according to the first embodiment of the present invention will be described with reference to FIGS. 1 to 3. The charged-particle beam lithographic apparatus 100 is configured to draw a pattern on a substrate W using a charged-particle beam. Note that typically the substrate W has a resist film formed on its surface, and a pattern is drawn on the resist film. Although an example in which an electron beam is employed as the charged-particle beam will be described herein, other charged-particle beams such as an ion beam may be employed.

The charged-particle beam lithographic apparatus 100 includes, for example, an electron gun (charged-particle source) 101, a collimator lens 103, an electron optical system ELO, a substrate holder (a substrate stage including a substrate chuck) 111 which holds the substrate W, and a driving mechanism 110 which drives the substrate holder 111. The substrate holder 111 and driving mechanism 110 constitute a positioning mechanism (stage mechanism) which positions the substrate W.

The electron gun 101 forms a crossover 102. Electrons 119 diverging from the crossover 102 are converted into a collimated electron beam by the collimator lens 103, and enter the electron optical system or optical system ELO. The electron optical system ELO can include, for example, an aperture array 104, electrostatic lens array 105, blanker array 106, stopping aperture array 107, deflector array 108, and electrostatic lens array 109 in the order named from the side of the electron gun 101. Note that each of the components 104 to 109 which constitute the electron optical system ELO provides an example of an aperture plate including apertures AP in a number equal to the number (first number) of electron beams for drawing a pattern on the substrate W.

The collimated electron beams from the collimator lens 103 enter the aperture array 104 of the electron optical system ELO. The aperture array 104 includes a plurality (first number) of circular apertures AP arrayed in a matrix, and generates a plurality of electron beams EB (extracts a plurality of electron beams EB from a bundle of electron beams). The plurality of electron beams EB that passed through the aperture array 104 enter the electrostatic lens array 105. The electrostatic lens array 105 can be formed by three electrode plates (these three electrode plates are shown as an integrated plate in FIGS. 1 to 5) including a plurality (first number) of circular apertures AP.

The stopping aperture array 107 including a plurality (first number) of apertures AP arrayed in a matrix is arranged on a plane on which the electron beams having passed through the apertures AP in the electrostatic lens array 105 form crossover images for the first time. The blanker array 106 is arranged between the electrostatic lens array 105 and the stopping aperture array 107. The blanker array 106 includes pluralities (first numbers) of apertures and blankers (deflectors) arrayed in a matrix. The electron beams deflected by the blankers are blocked by the stopping aperture array 107 and therefore do not strike the substrate W. On the other hand, the electron beams that are not deflected by the blankers pass through the apertures AP in the stopping aperture array 107 and strike the substrate W. Control for guiding/not guiding the electron beams onto the substrate W in this way is called blanking.

Figure 5:
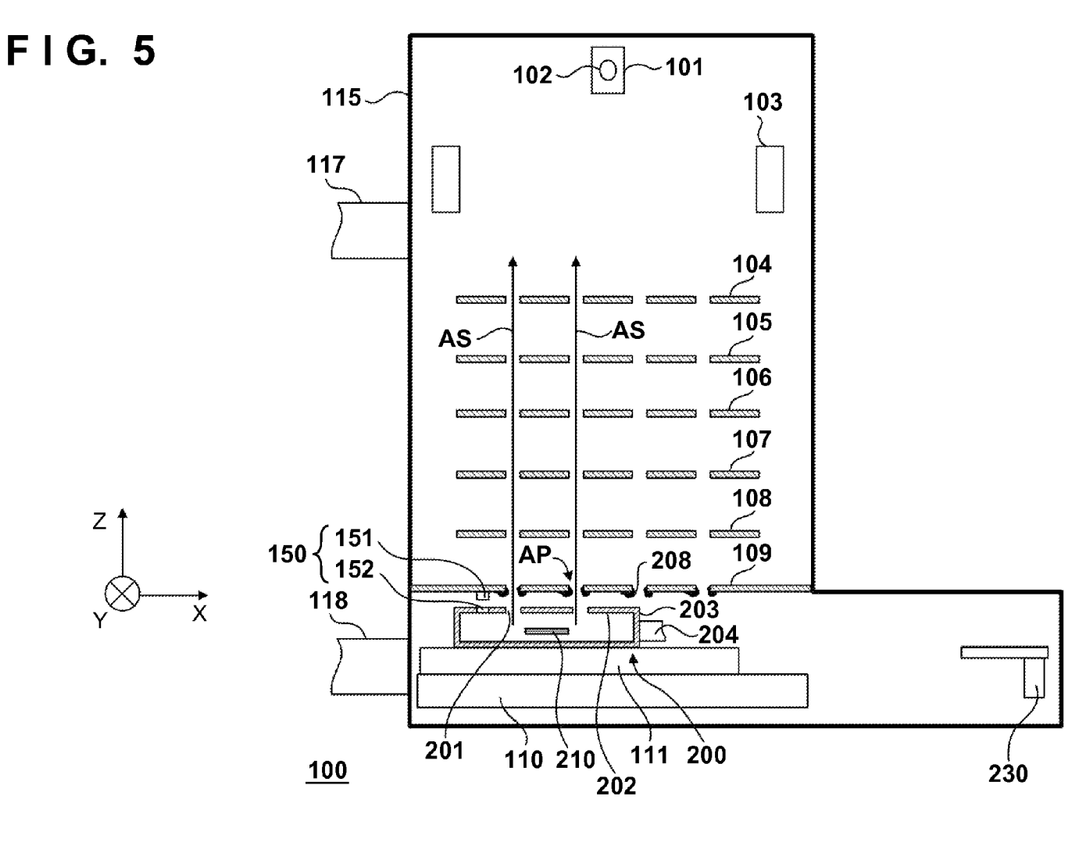
FIG. 5 is a view for explaining the configuration and cleaning process of the charged-particle beam lithographic apparatus according to the second embodiment of the present invention.
Figure 6:
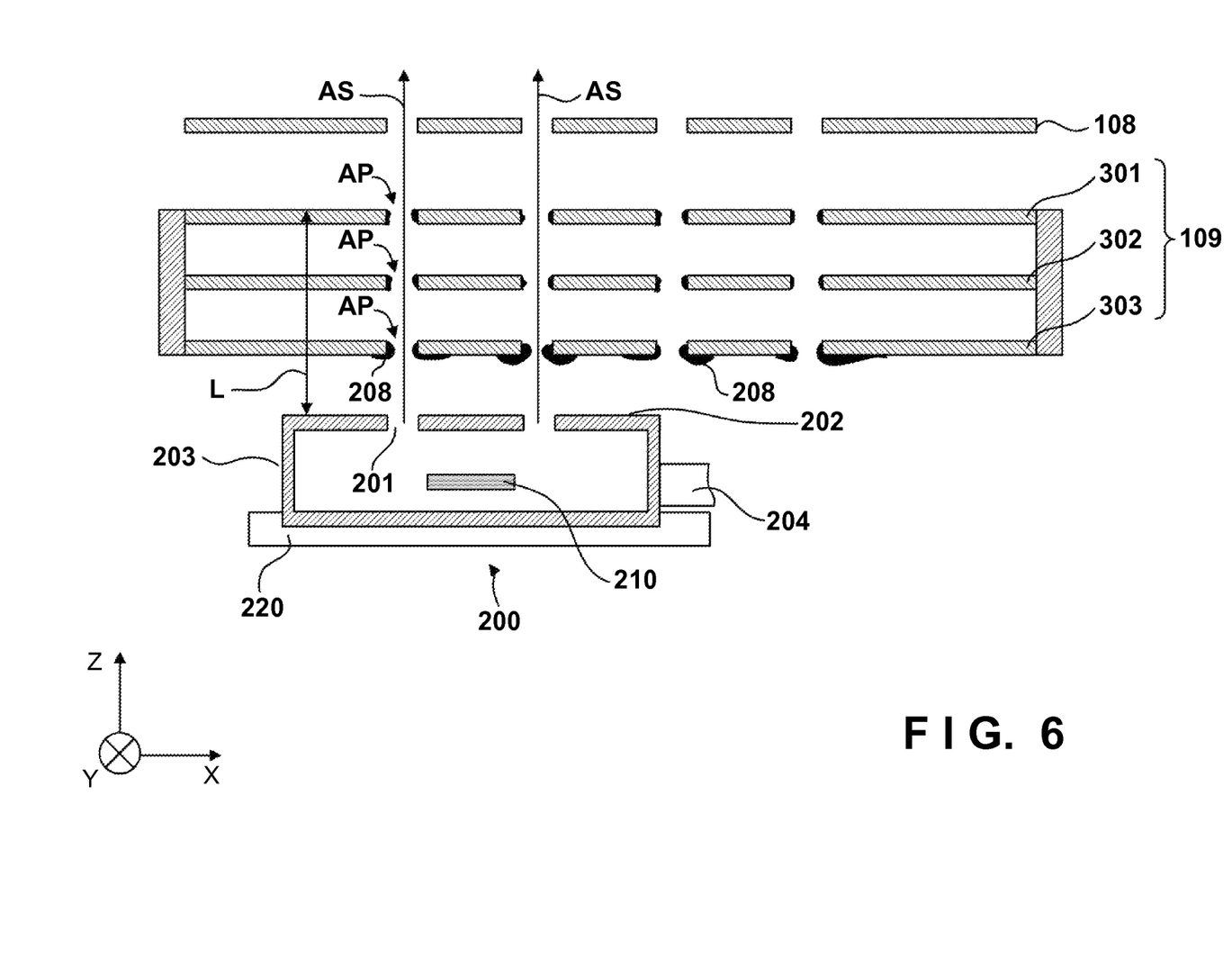
FIG. 6 is a view illustrating the configuration of an electrostatic lens array which exemplifies an aperture plate.

Each electron beam having passed through the stopping aperture array 107 is converged by the electrostatic lens array 109 to form an image of the crossover 102 on the substrate W. Although the electrostatic lens array 109 includes three electrode plates shown as an integrated plate in FIGS. 1 to 5, it can be formed by three electrode plates 301, 302, and 303 each including a plurality (first number) of circular apertures AP, as illustrated in FIG. 6, in practice. Note that each of the electrode plates 301, 302, and 303 can be construed as an aperture plate including a plurality of apertures AP as well. During drawing of a pattern on the substrate W, the substrate W held by the substrate holder 111 continuously moves in the X direction by the driving mechanism 110, and the electron beams incident on the substrate W are deflected in the Y direction by the deflectors of the deflector array 108. Upon this operation, a pattern is drawn on the resist on the surface of the substrate W to form a latent image in this resist.

To prevent attenuation of the electron beams and their discharge due to a high voltage, the main body portion (a portion including the electron gun 101, collimator lens 103, electron optical system ELO, substrate holder 111, and driving mechanism 110) of the charged-particle beam lithographic apparatus 100 is contained in a chamber 115. The pressure of the internal space of the chamber 115 can be maintained at, for example, $10^{-5}$ Pa or less. A high degree of vacuum is required especially for a first space SP1 in which the electron gun 101, collimator lens 103, and electron optical system ELO are arranged. Therefore, the first space SP1 can be evacuated by an exhaust system different from that which evacuates a second space SP2 in which the positioning mechanism (substrate holder 111 and driving mechanism 110) which generates a large amount of gas from, for example, the resist. The first space SP1 can be evacuated via an exhaust port 117, and the second space SP2 can be evacuated via an exhaust port 118. The first space SP1 and second space SP2 can be isolated from each other by the electrostatic lens array 109 but are nonetheless not separated completely in terms of space.

When the resist on the substrate W is irradiated with an electron beam, it emits an organic component gas. At the same time, the resist emits secondary electrons. Therefore, deposits 208 such as gas decomposition products may be formed on the surfaces of aperture plates close to the resist and, especially, the electrostatic lens array 109, and their side surfaces defining the apertures. The deposits 208 may be substances containing, for example, carbon as their major component.

To remove such deposits 208, the electron optical system ELO and, more specifically, the components (aperture plates) 104 to 109 which constitute it in the charged-particle beam lithographic apparatus 100 include a cleaning unit 200 which performs cleaning. Before the property of the electron optical system ELO changes and the drawing accuracy degrades in excess of a reference value upon generation of the deposits 208, the drawing process is stopped so that the cleaning unit 200 cleans the electron optical system ELO.

In cleaning the aperture plates, the substrate holder 111 is retracted from the region below the electron optical system ELO, as illustrated in, for example, FIG. 2. The cleaning unit 200 is used to clean the aperture plates. The cleaning unit 200 includes a case 203, active species source 210, and driving mechanism 220. The case 203 includes an emitting hole plate 202 including emitting holes 201 in a second number smaller than the first number, that is, the number of electrons for drawing a pattern on the substrate W. In cleaning, the case 203 is arranged so that of the first end of the electron optical system ELO facing the object plane (i.e., the side of the electron gun 101) and the second end of the electron optical system ELO facing the image plane (i.e., the side on which the substrate W is arranged), the second end faces the emitting hole plate 202. The active species source 210 generates an active species in the case 203. A supply portion 204 supplies a material gas serving as the source of an active species to the active species source 210. The supply portion 204 can include, for example, a tube such as a flexible tube connected to a material gas supply source arranged in the external space of the chamber 115.

The driving mechanism 220 moves the case 203 to the region below the electron optical system ELO in cleaning. During cleaning, an active species AS is emitted from the second number of emitting holes 201 by the difference between the pressures of the internal and external spaces of the case 203 arranged in the chamber 115. When the number (second number) of emitting holes 201 formed in the emitting hole plate 202 of the case 203 is smaller than the first number, that is, the number of electron beams for drawing a pattern on the substrate W, this is advantageous in raising the pressure of the internal space of the case 203. By raising the pressure of the internal space of the case 203, the density of active species emitted from the emitting holes 201 can be increased to supply an active species with a high density to the object to be cleaned. This makes it possible to supply the active species deeply into the apertures AP in each aperture plate such as the electrostatic lens array 109. Increasing the density of active species is also effective in cleaning the second and subsequent aperture plates when viewed from the cleaning unit 200. In the configuration of the electrostatic lens array 109 illustrated in, for example, FIG. 6, increasing the density of active species is advantageous in cleaning not only the first, electrode plate 303 but also the second and third, electrode plates 302 and 301 when viewed from the cleaning unit 200.

The driving mechanism 220 is configured to move the case 203. The case 203 is arranged in the chamber 115 at least during cleaning. The case 203 may be arranged in the chamber 115 during a process of drawing a pattern on the substrate W as well. Alternatively, the case 203 may be inserted in the chamber 115 through a load lock system (not shown) in a cleaning process.

The number (second number) of emitting holes 201 formed in the emitting hole plate 202 of the case 203 is smaller than the first number, that is, the number of electron beams for drawing a pattern on the substrate W, as described earlier. Hence, the driving mechanism 220 moves the case 203 while the emitting hole plate 202 faces the electron optical system ELO, so that all of the first number of apertures AP in the electrostatic lens array 109 are cleaned by the active species AS emitted from the emitting holes 201. FIGS. 2 and 3 schematically show how all of the first number of apertures AP in the electrostatic lens array 109 are cleaned while moving the case 203. Note that the pitch of the emitting holes 201 desirably matches that of the apertures AP in each aperture plate such as the electrostatic lens array 109. In this case, the active species AS emitted from each emitting hole 201 is easily supplied to a corresponding aperture AP.

The charged-particle beam lithographic apparatus 100 can include a positioning unit for aligning each aperture plate to be cleaned and the case 203 of the cleaning unit 200 with each other (more specifically, aligning the apertures AP and the emitting holes 201 with each other). The positioning unit can include, for example, a light-emitting portion 151 and light-receiving portion 152, one of which is attached to each aperture plate, and the other of which is attached to the case 203. Each aperture plate (for example, the electrostatic lens array 109) and the case 203 can be aligned with each other based on the relative position between the light-emitting portion 151 and the light-receiving portion 152, at which the intensity of light which is emitted by the light-emitting portion 151 and received by the light-receiving portion 152 maximizes.

The active species AS generated in the case 203 of the cleaning unit 200 is emitted from the emitting holes 201 by the difference in pressure between the internal and external spaces of the case 203, and reaches the first space SP1 through the apertures AP in each aperture plate which constitutes the electron optical system ELO. Note that in the example shown in FIG. 6, a flow channel other than the apertures AP is present between the first space SP1 and the space between the electrode plate 301 and the deflector array 108. In such a case, the active species AS can flow into the first space SP1 not only through the apertures AP but also through this flow channel.

The active species AS that enters the apertures AP in each aperture array such as the electrostatic lens array 109 can react with the deposits 208 on the side surfaces defining the apertures AP so that a volatile gas is generated and discarded. The active species AS supplied onto the surface of each aperture array such as the electrostatic lens array 109 can similarly react with the deposits 208 on this surface so that a volatile gas is generated and discarded. The material gas which generates the active species AS can be at least one of, for example, hydrogen, ammonia, oxygen, and ozone. Various methods of generating the active species AS by the active species source 210 can be adopted, and the active species source 210 can include, for example, a plasma generating portion or a hot filament.

After the cleaning of each aperture array such as the electrostatic lens array 109 is completed, the case 203 of the cleaning unit 200 is retracted from the region below the electron optical system ELO by the driving mechanism 220. After the gas in the internal space of the chamber 115 is exhausted via the exhaust ports 117 and 118 to reduce the pressure of the internal space of the chamber 115 to that required for a process of drawing a pattern on the substrate W, the drawing process can be executed. An example in which the three electrode plates 301, 302, and 303 of the electrostatic lens array 109, illustrated in FIG. 6, among the aperture arrays which constitute the electron optical system ELO are to be cleaned will be described herein.

As long as the mean free path of the active species AS from the case 203 is larger than a distance L between the case 203 and the upper end of the apertures in the electrode plate 301 farthest from the case 203 among the electrode plates 301, 302, and 303, the side surfaces defining the apertures AP in the electrode plate 301 can be cleaned. A mean free path $\lambda_a$ of hydrogen radicals (an active species of hydrogen) serving as the active species AS can be calculated as:

$$\lambda_a = \frac{1}{\sqrt{2}\,\pi d_a^2 n_a + \pi\left(\frac{d_a + d_b}{2}\right)^2 n_b \sqrt{1 + \frac{M_a}{M_b}}} \quad (1)$$

where da is the atomic radius of a hydrogen radical (cm), db is the molecular radius (cm) of a hydrogen molecule, na is the molecular density (/cm³) of a hydrogen molecule, Ma is the mass number of a hydrogen atom, and Mb is the mass number of a hydrogen molecule. Note that the mean free path $\lambda_a$ of hydrogen radicals at 50 Pa is 2.3 mm when da=6.20×10⁻⁹ cm, db=1.24×10⁻⁸ cm, and the concentration of hydrogen atoms is 1%.

In this example, as long as the pressures in the first space SP1 and second space SP2 are 50 Pa or less, and the distance L from the emitting holes 201 to the upper end of the electrode plate 301 is 2.3 mm or less, the hydrogen radicals reach the upper end of the apertures in the electrode plate 301 without inactivation.

Figure 4:
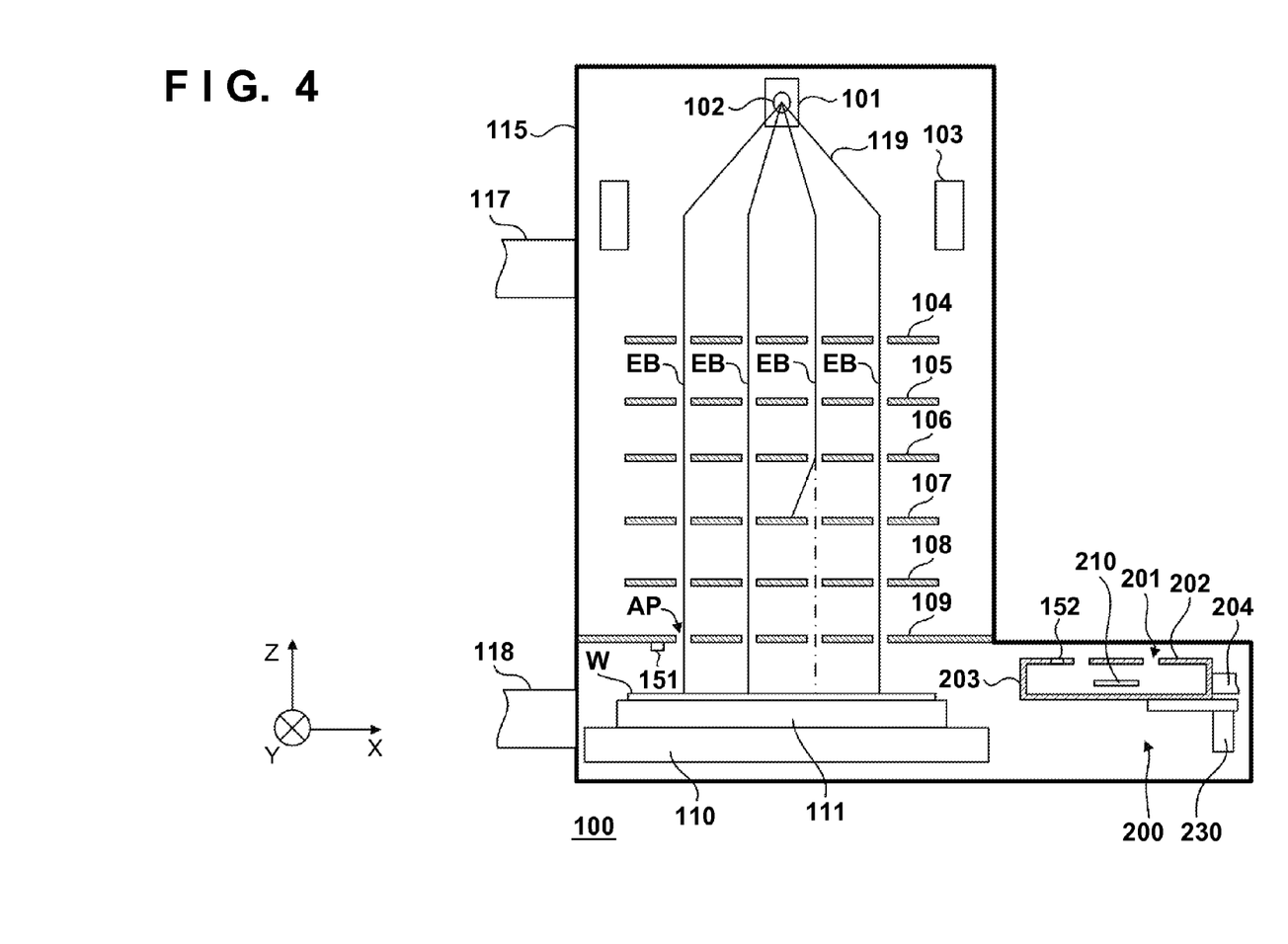
FIG. 4 is a view for explaining the configuration and drawing process of a charged-particle beam lithographic apparatus according to the second embodiment of the present invention.

A charged-particle beam lithographic apparatus 100 according to the second embodiment of the present invention will be described next with reference to FIGS. 4 and 5. Details that are not particularly referred to herein can be the same as in the first embodiment. In the second embodiment, a driving mechanism which drives a case 203 of a cleaning unit 200 also serves as a driving mechanism 110 which drives a substrate holder 111. That is, the case 203 is driven by the driving mechanism 110 which drives the substrate holder 111. More specifically, during drawing of a pattern on a substrate W, the substrate W is held by the substrate holder 111, as illustrated in FIG. 4. On the other hand, during cleaning of each aperture plate such as an electrostatic lens array 109, the case 203 is held by the substrate holder 111 so that an emitting hole plate 202 faces an electron optical system ELO, as illustrated in FIG. 5. The driving mechanism 110 moves the substrate holder 111 to move the case 203. A transport robot 230 can transport the case 203 to and from the substrate holder 111.

According to the second embodiment, since there is no need to retract the substrate holder 111 in cleaning, a chamber 115 or the charged-particle beam lithographic apparatus 100 can be downsized.

Practical Examples will be described below.

Example 1

Hydrogen gas is supplied from a supply portion 204 into a case 203 at a flow rate Q=1.35 Pa·m³/sec so that hydrogen radicals are generated by an active species source 210 and emitted through emitting holes 201. The hydrogen radicals pass through apertures in an electrostatic lens array 109 (electrode plates 301, 302, and 303). At this time, some of the hydrogen radicals react with deposits 208 to generate a volatile gas. The volatile gas and hydrogen gas are exhausted from a chamber 115 via an exhaust port 117. Note that when the exhaust of those gases from the exhaust port 117 was regulated so that the exhaust rate is 0.1 m³/sec on the side of the electrode plate 301, the amount of hydrogen gas exhausted from the exhaust port 117 became equal to that of hydrogen gas (containing hydrogen radicals) emitted from the emitting holes 201 of the case 203. The diameter of each emitting hole 201 is 60 μm, and the thickness of an emitting hole plate 202 is 300 μm. The diameter of each of the apertures in the electrode plates 301, 302, and 303 of the electrostatic lens array 109 is 120 μm, and the thickness of each of the electrode plates 301, 302, and 303 is 300 μm. The number (first number) of apertures is 40×40, and the electrostatic lens array 109 has a 100×100 square array.

When the pressure in each portion is calculated under the above-mentioned conditions, the pressure of the internal space of the case 203 is 300 Pa, that of a second space SP2 in the chamber 115 is 30 Pa, and that of a first space SP1 in the chamber 115 is 15 Pa. Hydrogen radicals emitted from the emitting holes 201 travel straight, thereby efficiently removing the deposits 208. Also, the pressure of the internal space of the case 203 is high enough to generate a sufficient amount of hydrogen radicals.

The sequence of driving the case 203 will be exemplified below. First, the position of the case 203, at which a light-receiving portion 152 has a maximum light reception efficiency, is detected and defined as an origin position. This position can be provided from a position control system or position measuring system (not shown) of a driving mechanism 220 in the first embodiment, and provided from a position measuring system (not shown) of a substrate holder 111 in the second embodiment.

Then, the case 203 is positioned so that at least one emitting hole 201 in the case 203 and the aperture to be cleaned in the electrostatic lens array 109 are aligned with each other in the X and Y directions, based on the array information of the emitting holes 201. Upon this operation, the aperture to be cleaned is cleaned by an active species AS emitted from the emitting hole 201. The case 203 is driven by the driving mechanism 220 in the first embodiment, and driven by a driving mechanism 110 in the second embodiment.

After the period of time in which the aperture to be cleaned is satisfactorily cleaned, the case 203 is positioned so that at least one emitting hole 201 in the case 203 and the aperture AP to be cleaned next are aligned with each other in the X and Y directions. Upon this operation, the aperture AP to be cleaned next is cleaned by the active species AS emitted from the emitting hole 201. The process as mentioned above is executed while changing the aperture AP to be cleaned, until all of a first number of apertures AP are cleaned.

Example 2

Figure 7A:
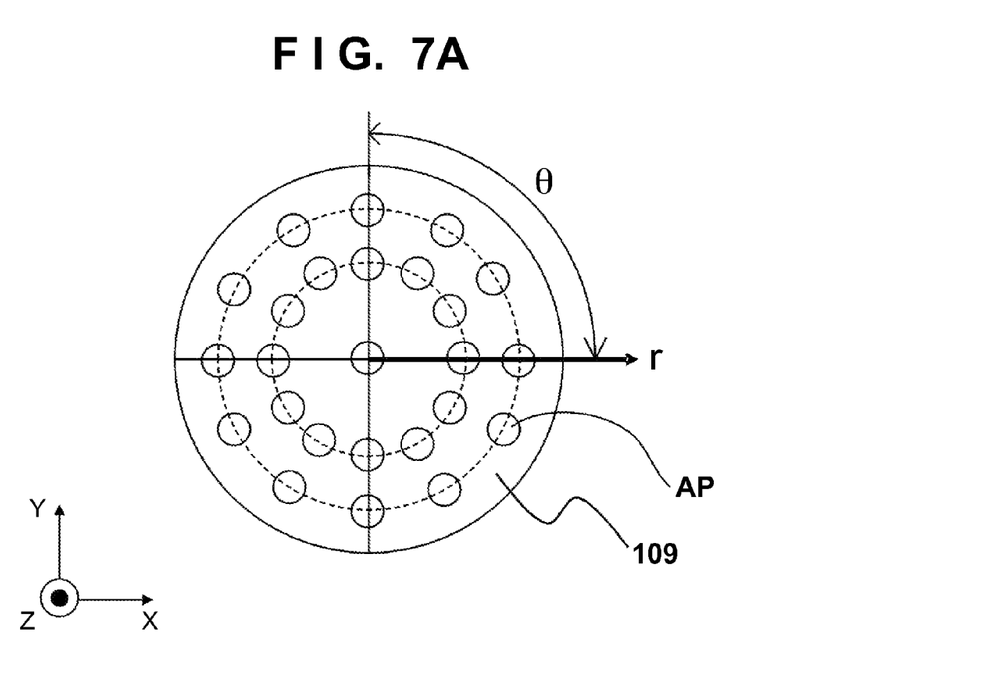
FIGS. 7A and 7B are views for explaining Examples.
Figure 7B:
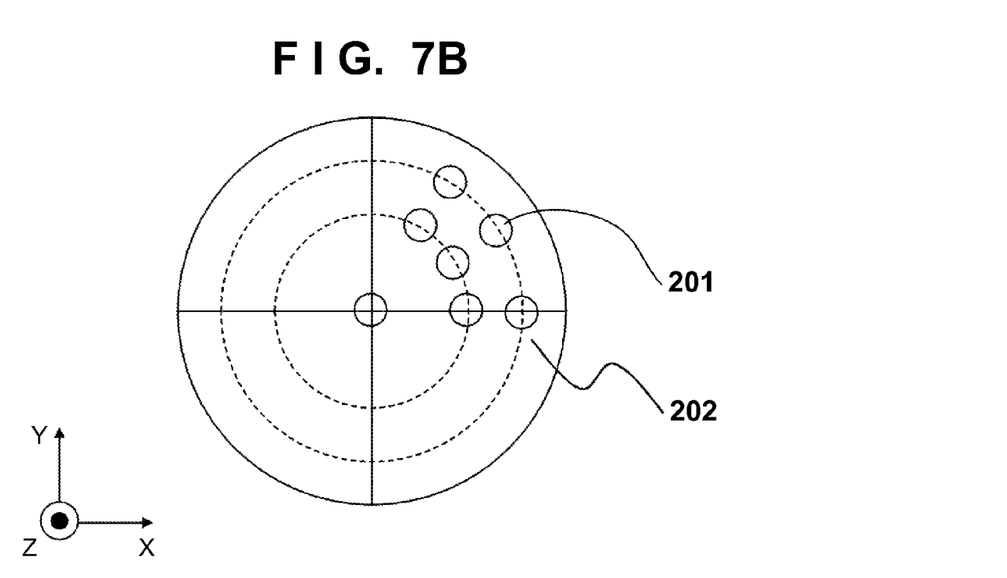

In Example 2, the electrostatic lens array 109 schematically shown in FIG. 7A is cleaned using a cleaning unit including a case 203 having an emitting hole plate 202 schematically shown in FIG. 7B.

First, an origin position is determined in the same way as in Example 1. The case 203 is positioned so that emitting holes 201 in the case 203 and a group of apertures AP to be cleaned in the electrostatic lens array 109 are aligned with each other in the Or direction (X and Y directions), based on the array information of the emitting holes 201. Upon this operation, the group of apertures AP to be cleaned is cleaned by an active species AS emitted from the emitting holes 201. The case 203 is driven by a driving mechanism 220 in the first embodiment, and driven by a driving mechanism 110 in the second embodiment.

After the period of time in which the group of apertures to be cleaned is satisfactorily cleaned, the case 203 is rotated through π/6 about the Z-axis so that the emitting holes 201 face a group of apertures AP to be cleaned next. Upon this operation, the group of apertures to be cleaned next is cleaned by the active species AS emitted from the emitting holes 201. The process as mentioned above is executed while changing the group of apertures AP to be cleaned, until all of a first number of apertures AP are cleaned.

A method of manufacturing a device according to an embodiment of the present invention will be described next. The device can be, for example, a semiconductor device. A semiconductor device is manufactured by a preprocess of forming an integrated circuit on a wafer (semiconductor substrate), and a post-process of completing, as a product, a chip of the integrated circuit formed on the wafer by the preprocess. The preprocess can include a step of exposing a wafer, coated with a photosensitive agent, using the above-mentioned charged-particle beam lithographic apparatus, and a step of developing the wafer. The post-process can include an assembly step (dicing and bonding) and packaging step (encapsulation).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-104739, filed May 9, 2011, which is hereby incorporated by reference herein in its entirety.

What is claimed is:

1. A lithographic apparatus which performs drawing a pattern on a substrate with a plurality of charged-particle beams, the apparatus comprising:
   an optical system including, at an end of the optical system, which faces the substrate, an aperture plate having a plurality of apertures to pass the plurality of charged-particle beams; and
   a cleaning unit, comprising a case including an emitting hole plate having a plurality of emitting holes, an active species source configured to generate active species in the case, and a driving mechanism configured to move the case relative to the optical system in a state that the emitting hole plate faces the aperture plate, configured to remove contaminants deposited on the plurality of apertures, using the active species emitted from the plurality of emitting holes
   wherein the plurality of apertures includes a first aperture, a second aperture and a third aperture,
   wherein the plurality of emitting holes includes a first emitting hole and a second emitting hole,
   wherein an interval between the first aperture and the second aperture matches an interval between the first emitting hole and the second emitting hole, and
   wherein the driving mechanism is configured to move the case to a position, where the cleaning unit is capable of removing contaminants deposited on the first aperture using active species emitted from the first emitting hole, and the cleaning unit is capable of removing contaminants deposited on the second aperture using active species emitted from the second emitting hole, and then to a position where the cleaning unit is capable of removing contaminants deposited on the third aperture using active species emitted from the first emitting hole.

2. The apparatus according to claim 1, further comprising a holder configured to hold the substrate, wherein for cleaning the aperture plate, the driving mechanism moves the case so that the emitting hole plate faces the optical system, with the holder retracted.

3. The apparatus according to claim 1, further comprising a holder configured to hold the substrate, wherein the driving mechanism is configured to drive the holder, and for cleaning the aperture plate, the holder holds the case of the cleaning unit and the driving mechanism moves the holder to move the case.

4. The apparatus according to claim 1, further comprising a detecting system configured to detect a position of the case relative to the optical system, wherein the driving mechanism moves the case relative to the optical system based a detection by the detecting system.

5. A method of cleaning performed in a lithographic apparatus which performs drawing a pattern on a substrate with a plurality of charged-particle beams, the apparatus comprising:
- an optical system including, at an end of the optical system, which faces the substrate, an aperture plate having a plurality of apertures to pass the plurality of charged-particle beams; and
- a cleaning unit, comprising a case including an emitting hole plate having a plurality of emitting holes, an active species source configured to generate active species in the case, and a driving mechanism configured to move the case relative to the optical system in a state that the emitting hole plate faces the aperture plate, configured to remove contaminants deposited on the plurality of apertures, using the active species emitted from the plurality of emitting holes,
- wherein the plurality of apertures includes a first aperture, a second aperture and a third aperture,
- wherein the plurality of emitting holes includes a first emitting hole and a second emitting hole,
- wherein an interval between the first aperture and the second aperture matches an interval between the first emitting hole and the second emitting hole the method comprising:
- first moving the case, by the driving mechanism, to a position where the cleaning unit is capable of removing contaminants deposited on the first aperture using active species emitted from the first emitting hole, and the cleaning unit is capable of removing contaminants deposited on the second aperture using active species emitted from the second emitting hole; and
- second moving the case, after first moving the case, by the driving mechanism, to a position where the cleaning unit is capable of removing contaminants deposited on the third aperture using active species emitted from the first emitting hole.

6. The apparatus according to claim 1, wherein
the plurality of apertures further includes a fourth aperture,
an interval between the third aperture and the fourth aperture matches the interval between the first emitting hole and the second emitting hole, and
in a state that the driving mechanism has moved the case to the position where the cleaning unit is capable of removing contaminants deposited on the third aperture using active species emitted from the first emitting hole, the cleaning unit removes contaminants deposited on the fourth aperture using active species emitted from the second emitting hole.

* * * * *